United States Patent
Yang et al.

(10) Patent No.: US 8,681,441 B2
(45) Date of Patent: Mar. 25, 2014

(54) SYSTEMS AND METHODS FOR GENERATING PREDICTABLE DEGRADATION BIAS

(75) Inventors: Shaohua Yang, Santa Clara, CA (US); Weijun Tan, Longmont, CO (US); Zongwang Li, San Jose, CA (US); Fan Zhang, Milpitas, CA (US); Yang Han, Sunnyvale, CA (US)

(73) Assignee: LSI Corporation, San Jose, CA (US)

( * ) Notice: Subject to any disclaimer, the term of this patent is extended or adjusted under 35 U.S.C. 154(b) by 195 days.

(21) Appl. No.: 13/227,544

(22) Filed: Sep. 8, 2011

(65) Prior Publication Data
US 2013/0063835 A1    Mar. 14, 2013

(51) Int. Cl.
G11B 20/10 (2006.01)
G11B 5/035 (2006.01)
G11B 5/03 (2006.01)

(52) U.S. Cl.
USPC ................... 360/39; 360/65; 360/66

(58) Field of Classification Search
None
See application file for complete search history.

(56) References Cited

U.S. PATENT DOCUMENTS

| | | |
|---|---|---|
| 5,278,703 A | 1/1994 | Rub |
| 5,278,846 A | 1/1994 | Okayama et al. |
| 5,317,472 A | 5/1994 | Schweitzer, III |
| 5,325,402 A | 6/1994 | Ushirokawa |
| 5,392,299 A | 2/1995 | Rhines et al. |
| 5,471,500 A | 11/1995 | Blaker et al. |
| 5,513,192 A | 4/1996 | Janku et al. |
| 5,523,903 A | 6/1996 | Hetzler |
| 5,550,870 A | 8/1996 | Blaker et al. |
| 5,612,964 A | 3/1997 | Haraszti |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |
| 5,768,044 A | 6/1998 | Hetzler |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.

(Continued)

*Primary Examiner* — Regina N Holder
(74) *Attorney, Agent, or Firm* — Hamilton DeSanctis & Cha

(57) ABSTRACT

Various embodiments of the present invention provide systems and methods for data processing. As an example, a data processing circuit is disclosed that includes a data detector circuit and a bias calculation circuit. The data detector circuit is operable to apply a data detection algorithm to a first data set to yield a first series of soft decision data, and to apply the data detection algorithm to a second data set to yield a second series of soft decision data. The bias calculation circuit operable to calculate a series of bias values based at least in part on the first series of soft decision data and the second series of soft decision data. The series of bias values correspond to a conversion between the first series of soft decision data and the second series of soft decision data.

20 Claims, 8 Drawing Sheets

(56) References Cited

U.S. PATENT DOCUMENTS

| | | |
|---|---|---|
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,065,149 A | 5/2000 | Yamanaka |
| 6,097,764 A | 8/2000 | McCallister et al. |
| 6,145,110 A | 11/2000 | Khayrallah |
| 6,216,249 B1 | 4/2001 | Bliss et al. |
| 6,216,251 B1 | 4/2001 | McGinn |
| 6,229,467 B1 | 5/2001 | Eklund et al. |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,381,726 B1 | 4/2002 | Weng |
| 6,438,717 B1 | 8/2002 | Butler et al. |
| 6,473,878 B1 | 10/2002 | Wei |
| 6,476,989 B1 | 11/2002 | Chainer et al. |
| 6,625,775 B1 | 9/2003 | Kim |
| 6,657,803 B1 | 12/2003 | Ling et al. |
| 6,671,404 B1 | 12/2003 | Kawatani et al. |
| 6,748,034 B2 | 6/2004 | Hattori et al. |
| 6,757,862 B1 | 6/2004 | Marianetti |
| 6,785,863 B2 | 8/2004 | Blankenship et al. |
| 6,788,654 B1 | 9/2004 | Hashimoto et al. |
| 6,810,502 B2 | 10/2004 | Eidson |
| 6,980,382 B2 | 12/2005 | Hirano et al. |
| 6,986,098 B2 | 1/2006 | Poeppelman |
| 7,010,051 B2 | 3/2006 | Murayama et al. |
| 7,047,474 B2 | 5/2006 | Rhee et al. |
| 7,058,873 B2 | 6/2006 | Song et al. |
| 7,073,118 B2 | 7/2006 | Greenberg et al. |
| 7,093,179 B2 | 8/2006 | Shea |
| 7,113,356 B1 | 9/2006 | Wu |
| 7,136,244 B1 | 11/2006 | Rothbert |
| 7,173,783 B1 | 2/2007 | McEwen et al. |
| 7,184,486 B1 | 2/2007 | Wu et al. |
| 7,191,378 B2 | 3/2007 | Eroz et al. |
| 7,203,015 B2 | 4/2007 | Sakai et al. |
| 7,203,887 B2 | 4/2007 | Eroz et al. |
| 7,236,757 B2 | 6/2007 | Raghaven et al. |
| 7,257,764 B2 | 8/2007 | Suzuki et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,403,752 B2 | 7/2008 | Raghaven et al. |
| 7,430,256 B2 | 9/2008 | Zhidkov |
| 7,502,189 B2 | 3/2009 | Sawaguchi et al. |
| 7,505,537 B1 | 3/2009 | Sutardja |
| 7,509,138 B2 | 3/2009 | Shin et al. |
| 7,523,375 B2 | 4/2009 | Spencer |
| 7,587,657 B2 | 9/2009 | Haratsch |
| 7,590,168 B2 | 9/2009 | Raghaven et al. |
| 7,702,989 B2 | 4/2010 | Graef et al. |
| 7,712,008 B2 | 5/2010 | Song et al. |
| 7,738,201 B2 | 6/2010 | Jin et al. |
| 7,752,523 B1 | 7/2010 | Chaichanavong |
| 7,801,200 B2 | 9/2010 | Tan |
| 7,802,163 B2 | 9/2010 | Tan |
| 2003/0063405 A1 | 4/2003 | Jin et al. |
| 2003/0081693 A1 | 5/2003 | Raghaven et al. |
| 2003/0087634 A1 | 5/2003 | Raghaven et al. |
| 2003/0112896 A1 | 6/2003 | Raghaven et al. |
| 2003/0134607 A1 | 7/2003 | Raghaven et al. |
| 2004/0071206 A1 | 4/2004 | Takatsu |
| 2004/0098659 A1 | 5/2004 | Bjerke et al. |
| 2005/0010855 A1 | 1/2005 | Lusky |
| 2005/0078399 A1 | 4/2005 | Fung |
| 2005/0111540 A1 | 5/2005 | Modrie et al. |
| 2005/0157780 A1 | 7/2005 | Werner et al. |
| 2005/0195749 A1 | 9/2005 | Elmasry et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0123285 A1 | 6/2006 | De Araujo et al. |
| 2006/0140311 A1 | 6/2006 | Ashley et al. |
| 2006/0168493 A1 | 7/2006 | Song |
| 2006/0195772 A1 | 8/2006 | Graef et al. |
| 2006/0210002 A1 | 9/2006 | Yang et al. |
| 2006/0248435 A1 | 11/2006 | Haratsch |
| 2006/0256670 A1 | 11/2006 | Park et al. |
| 2007/0011569 A1 | 1/2007 | Casado et al. |
| 2007/0047121 A1 | 3/2007 | Elefeheriou et al. |
| 2007/0047635 A1 | 3/2007 | Stojanovic et al. |
| 2007/0110200 A1 | 5/2007 | Mergen et al. |
| 2007/0230407 A1 | 10/2007 | Petrie et al. |
| 2007/0286270 A1 | 12/2007 | Huang et al. |
| 2008/0049825 A1 | 2/2008 | Chen et al. |
| 2008/0055122 A1 | 3/2008 | Tan |
| 2008/0065970 A1 | 3/2008 | Tan |
| 2008/0069373 A1 | 3/2008 | Jiang et al. |
| 2008/0168330 A1 | 7/2008 | Graef et al. |
| 2008/0276156 A1 | 11/2008 | Gunnam |
| 2008/0301521 A1 | 12/2008 | Gunnam |
| 2009/0185643 A1 | 7/2009 | Fitzpatrick |
| 2009/0199071 A1 | 8/2009 | Graef |
| 2009/0235116 A1 | 9/2009 | Tan et al. |
| 2009/0235146 A1 | 9/2009 | Tan |
| 2009/0259915 A1 | 10/2009 | Livshitz et al. |
| 2009/0273492 A1 | 11/2009 | Yang et al. |
| 2009/0274247 A1 | 11/2009 | Galbraith et al. |
| 2010/0002795 A1 | 1/2010 | Raghaven et al. |
| 2010/0042877 A1 | 2/2010 | Tan |
| 2010/0042890 A1 | 2/2010 | Gunam |
| 2010/0050043 A1 | 2/2010 | Valentin Savin |
| 2010/0061492 A1 | 3/2010 | Noeldner |
| 2010/0070837 A1 | 3/2010 | Xu et al. |
| 2010/0164764 A1 | 7/2010 | Nayak |
| 2010/0185914 A1 | 7/2010 | Tan et al. |
| 2011/0075569 A1 | 3/2011 | Marrow et al. |
| 2011/0080211 A1 | 4/2011 | Yang et al. |
| 2011/0167246 A1 | 7/2011 | Yang et al. |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed Sep. 21, 2010, Liu, et al.
U.S. Appl. No. 12/901,816, filed Oct. 11, 2010, Li, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.
U.S. Appl. No. 13/126,748, filed Apr. 28, 2011, Tan.
U.S. Appl. No. 13/167,764, filed Jun. 24, 2011, Li, Zongwang, et al.
U.S. Appl. No. 13/167,771, filed Jun. 24, 2011, Li, Zongwang, et al.

(56) References Cited

OTHER PUBLICATIONS

U.S. Appl. No. 13/167,775, filed Jun. 24, 2011, Li, Zongwang.
U.S. Appl. No. 13/186,146, filed Jul. 19, 2011, Mathew, et al.
U.S. Appl. No. 13/186,213, filed Jul. 19, 2011, Mathew, et al.
U.S. Appl. No. 13/186,234, filed Jul. 19, 2011, Xia, Haitao, et al.
U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011, Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding" [online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System" Architectures: Synergies with Solid-State Disks Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. On Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC Techron, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.

SYSTEMS AND METHODS FOR GENERATING PREDICTABLE DEGRADATION BIAS

BACKGROUND OF THE INVENTION

The present inventions are related to systems and methods for storing data, and more particularly to systems and methods for characterizing a storage device.

Manufacturing storage devices includes a process of operating a given device to determine whether it satisfies defined quality criteria. As the quality criteria may allow only a small number of failures, it may take a long period of testing to determine whether the small number of failures occurs or not. This long period of time increases the cost of characterizing the device.

Hence, for at least the aforementioned reasons, there exists a need in the art for advanced systems and methods for characterizing a storage device.

BRIEF SUMMARY OF THE INVENTION

The present inventions are related to systems and methods for storing data, and more particularly to systems and methods for characterizing a storage device.

Various embodiments of the present invention provide data processing circuits that include: a data detector circuit and a bias calculation circuit. The data detector circuit is operable to apply a data detection algorithm to a first data set to yield a first series of soft decision data, and to apply the data detection algorithm to a second data set to yield a second series of soft decision data. The bias calculation circuit operable to calculate a series of bias values based at least in part on the first series of soft decision data and the second series of soft decision data. The series of bias values correspond to a conversion between the first series of soft decision data and the second series of soft decision data. In some instances of the aforementioned embodiments, the data detection algorithm is a maximum a posteriori data detection algorithm. In other instances, the data detection algorithm is a Viterbi data detection algorithm.

In some instances of the aforementioned embodiments, the bias calculation circuit includes a histogram calculation circuit operable to generate a first histogram of the values of the first series of soft decision data, and to generate a second histogram of the values of the second series of soft decision data. In some cases, the bias calculation circuit further includes a histogram normalizing circuit operable to normalize the first histogram to yield a first normalized histogram, and to normalize the second histogram to yield a second normalized histogram. In a particular case, the histogram normalizing circuit is operable to divide the number of instances of each value of the first series of soft decision data in the first histogram by a sum of the number of instances of all values of the first series of soft decision data in the first histogram, and to divide the number of instances of each value of the second series of soft decision data in the second histogram by a sum of the number of instances of all values of the second series of soft decision data in the second histogram.

In various cases, the bias calculation circuit further includes a cumulative mass calculation circuit operable to calculate a first cumulative mass of the first normalized histogram, and to calculate a second cumulative mass of the second normalized histogram. In some cases, the cumulative mass calculation circuit is operable to, for each value of the first series of soft decision data in the first histogram, sum the number of instances of each value of the first series of soft decision data in the first histogram less than a current value of the first series of soft decision data in the first histogram, and to, for each value of the second series of soft decision data in the second histogram, sum the number of instances of each value of the second series of soft decision data in the second histogram less than a current value of the second series of soft decision data in the second histogram. In one or more cases, the bias calculation circuit further includes a bias value calculation circuit operable to calculate the series of bias values based at least in part on the first cumulative mass and the second cumulative mass.

Various embodiments of the present invention provide methods for generating bias values to predictably increasing an error rate of a data processing circuit. Such methods include: receiving a first data set; applying a data detection algorithm by a data detector circuit to the first data set to yield a first series of soft decision data; receiving a second data set; applying the data detection algorithm by the data detector circuit to the second data set to yield a second series of soft decision data; calculating a series of bias values based at least in part on the first series of soft decision data and the second series of soft decision data, wherein the series of bias values correspond to a conversion between the first series of soft decision data and the second series of soft decision data.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for storing data, and more particularly to systems and methods for characterizing a storage device.

Figure 1:
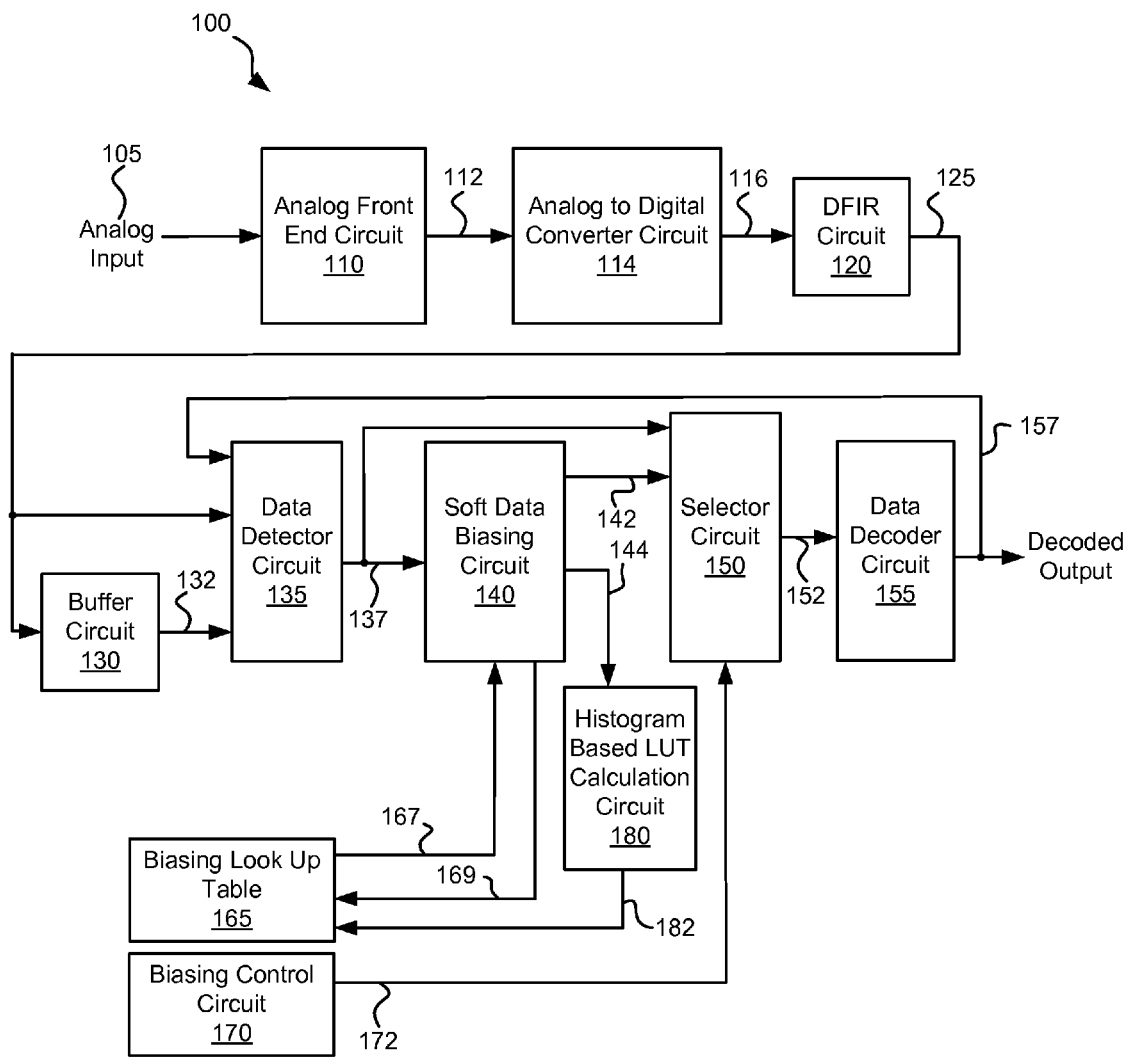
FIG. 1 depicts a data processing circuit including selectable operation degrading circuitry in accordance in some embodiments of the present invention.

FIG. 1 depicts a data processing circuit 100 including selectable operation degrading circuitry in accordance in some embodiments of the present invention. Data processing circuit 100 includes an analog front end circuit 110 that receives an analog input 105 and provides a processed analog signal 112. Analog front end circuit 110 may be any analog processing circuit known in the art. In one particular embodiment of the present invention, analog front end circuit 110 includes an amplifier circuit and a continuous time filter (i.e., an analog filter) that operate to amplify and noise filter the received input to yield processed analog signal 112. Analog signal 105 may be derived from a variety of sources including, but not limited to, a storage medium or a transfer medium. Based upon the disclosure provided herein, one of ordinary skill in the art will recognize a variety of sources from which analog input signal 105 may be derived.

Processed analog signal 112 is provided to an analog to digital converter circuit 114 that samples processed analog signal 112 to yield a corresponding series of digital samples 116. Analog to digital converter circuit 114 may be any circuit known in the art that is capable of converting a continuous time signal to a series of digital values. Digital samples 116 are provided to an equalizer circuit 120 that may be implemented as a digital finite impulse response circuit as are known in the art. Equalizer circuit 120 performs an equalization on digital samples 116 to yield an equalized output 125. Based upon the disclosure provided herein, one of ordinary skill in the art will recognize a variety of equalizer circuits that may be used in relation to different embodiments of the present invention.

Equalized output 125 is provided to a data detector circuit 135 and to a buffer circuit 130. Data detector circuit 135 applies a data detection algorithm to equalized output 125 to yield a detected output 137. Data detector circuit 135 may be any data detector circuit known in the art including, but not limited to, a Viterbi algorithm data detector circuit or a maximum a posteriori data detector circuit. In some cases, detected output 137 includes both hard decision data and soft decision data. As used herein, the phrase "hard decision data" refers to a data output that indicates a certain logic level for a given bit period or bit periods. For example, in a binary system, the logic level may be a '1' or a '0'. As another example, in a two bit binary system, the logic level may be "00', '01', '10' or '11'. Based upon the disclosure provided herein, one of ordinary skill in the art will recognize a variety of hard decision data that may be produced by a data detector circuit. As used herein, the phrase "soft decision data" refers to a data output that indicates a likelihood that data detector circuit 135 correctly detected data for the bit period or bit periods. In one particular embodiment of the present invention, soft decision data ranges from negative fifteen (−15) to positive fifteen (+15) with −15 indicating that the decision is highly unlikely to be correct and +15 indicating that the decision is highly likely to be correct. The increasing values from −14 to +14 correspond to a corresponding increase in the likelihood that the decision was correct. Based upon the disclosure provided herein, one of ordinary skill in the art will recognize a variety of values and ranges that may be used to represent the soft decision data.

In a non-binary data processing system, groups of symbols are processed together. For example, in a two bit, non-binary data processing system groups of two bit symbols are processed together with the groups of two bit symbols being capable of representing four possible outputs (i.e., 00, 01, 10, 11). In such systems, metrics (i.e., Euclidean distances) are calculated for each of the possible symbol values. In the case of two bit symbols, four metrics are calculated. A large metric value indicates that the corresponding symbol value is unlikely, and a small metric indicates a higher degree of likelihood. A symbol is in error when the correctly selected symbol value does not correspond to the smallest of the metrics. In contrast, a symbol is determined to be correct when the correctly selected symbol value corresponds to the smallest of the metrics. The later discussed decoding algorithm processes the multiple metrics to correct any errors. Detected output 137 includes the metrics for each of the possible values for the symbol values as soft data decisions, and may or may not include the symbol value corresponding to the smallest metric.

Detected output 137 is provided to both a soft data biasing circuit 140 and a selector circuit 150. Soft data biasing circuit 140 is operable to bias the soft decision data included in detected output 137 to yield a modified detected output 142. In particular, the soft decision data from detected output 137 is converted from non-binary metrics to relative metrics, biased by applying noise biasing to the relative metrics to yield biased relative metrics, and the biased relative metrics converted back into non-binary metrics (i.e., updated binary metrics).

Converting from the non-binary metrics to relative metrics includes calculating relative differences between the received non-binary metrics such that a zero value is assigned to the metric corresponding to the most likely symbol value, and non-negative metrics are assigned to all other possible symbol values. Using a two-bit, non-binary data processing system as an example where there are four possible symbol values (i.e., 00, 01. 10, 11) and corresponding non-binary metrics (i.e., $M_{00}$, $M_{01}$, $M_{10}$, and $M_{11}$) included in detected output 137, relative metrics ($RM_{00}$, $RM_{01}$, $RM_{10}$, and $RM_{11}$) are calculated in accordance with the following equations:

$$RM_{00} = M_{00} - \text{Reference Metric},$$

$$RM_{01} = M_{01} - \text{Reference Metric},$$

$$RM_{10} = M_{10} - \text{Reference Metric, and}$$

$$RM_{11} = M_{11} - \text{Reference Metric},$$

where the Reference Metric is the metric value corresponding to the true symbol value (i.e., a test pattern) that was written. The metric value corresponding to the true symbol value may be regenerated from memory or using another approach such as accessing the reference metric from a pre-programmed memory.

As will be appreciated, the relative metric corresponding to the correct symbol value is zero where it was properly selected. If the data detection is correct, then all metrics would be non-negative. Alternatively, if detection is not correct, then the symbol with the minimum metric will be different from the correct symbol. In this case of an incorrect detection, the relative metric for the detector had decision symbol is negative.

Soft data biasing circuit 140 biases the non-zero relative metrics to yield biased relative metrics. This may be done in a way that distorts detected output 137 such that the errors resulting from the distortion is predictably related to the number of errors that would result where no distortion is applied. By predictably degrading the operation of data processing circuit 100, the time required to generate a sufficient number of errors to characterize a system in which data processing circuit 100 is deployed is decreased, and because the number of errors corresponding from the degraded operation is predictably related to an actual number of errors, the characterization represents the actual operation of the system. In some cases, all of the non-zero relative metrics are replaced by biased relative metrics 167 accessed from a biasing look up table 165. Biased relative metrics 167 corresponds to the corresponding calculated relative metrics that are provided to biasing look up table 165 as an address 169. In turn, soft data biasing circuit 140 replaces the respective relative metrics using the returned biased relative metrics.

It has been determined that the errors are mostly related to the most likely symbol (with a small relative metric value), and the biasing function for the other less likely symbol values is less relevant to error correction performance. Because of this, the same bias value may be applied to all of the non-zero relative metrics in an effort to save hardware complexity. Thus, for example, a single relative metric is provided to biasing look up table 165 as an address 169 that returns a single biased relative metric 167. This biased relative metric 167 is used in place of all of the non-zero relative metrics. In other cases, the bias values may be selected based upon the correctly selected symbol value (i.e., the lowest relative metric value) as in a magnetic based storage device there is intrinsically more noise with transitioning symbols (e.g., '01' and '10') compared with non-transitioning symbols (e.g., '11' and '00') due to the nature of magnetic recording physics.

Converting the biased relative metrics back into non-binary metrics is substantially the inverse of the previously described conversion from the non-binary metrics into the relative metrics. Using the same two-bit, non-binary data processing system as an example, updated non-binary metrics (i.e., $UNBM_{00}$, $UNBM_{01}$, $UBM_{10}$, and $UNBM_{11}$) are calculated from the biased relative metrics (i.e., $BRM_{00}$, $BRM_{01}$, $BRM_{10}$, and $BRM_{11}$) in accordance with the following equations:

$UNBM_{00}=BRM_{00}$-Minimum Relative Metric, $UNBM_{01}=BRM_{01}$-Minimum Relative Metric, $UNBM_{10}=BRM_{10}$-Minimum Relative Metric, and $UNBM_{11}=BRM_{11}$-Minimum Relative Metric, where the Minimum Relative Metric is the biased relative metric ($BRM_{00}$, $BRM_{01}$, $BRM_{10}$, and $BRM_{11}$) that has the lowest value. The updated non-biased metrics are provided as part of modified detected output 142. It should be noted that while the example of soft biasing circuit 140 is a two-bit example that the same approach may be expanded for application to non-binary data processing systems operating on symbols including three or more bits per symbol.

In addition, soft data biasing circuit 140 provides soft decision data from detected output 137 and soft decision data from modified detected output 142 as a soft decision output 144 to a histogram based look up table calculation circuit 180. Histogram based look up table calculation circuit 180 histograms the instances of the received soft decision output 144 corresponding to multiple instances of detected output 137. Histograms corresponding to two different instances of detected output 137 (i.e., a first series of detected outputs corresponding to a first codeword, and a second series of detected outputs corresponding to a second codeword) each exhibiting a different error rate are used to calculate bias values 182 corresponding to the degradation between the two instances of detected output 137.

Figure 5A:
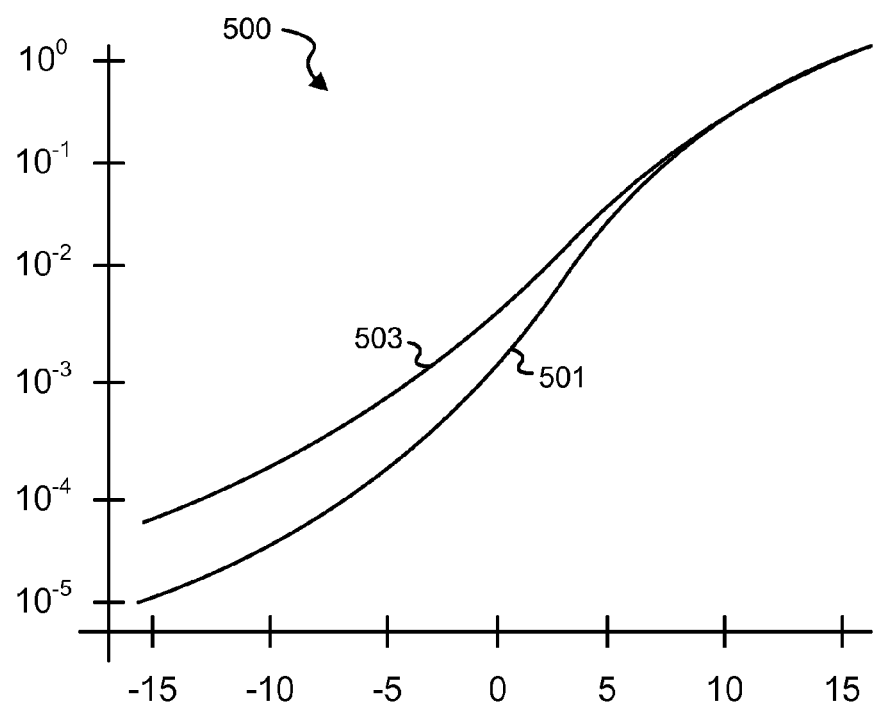
FIG. 5a is a histogram diagram showing distribution of soft data outputs for both a standard operation and a degraded operation.
Figure 5B:
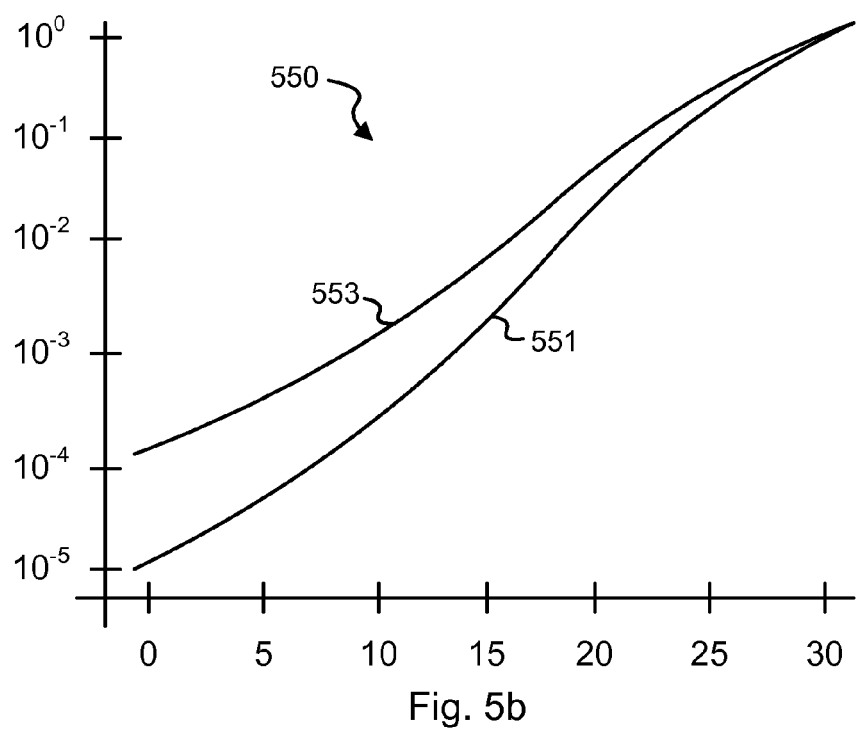
FIG. 5b is a histogram diagram showing distribution of normalized soft data outputs for both a standard operation and a degraded operation.

Turning to FIG. 5a, a graphical depiction 500 shows an example of histogram A (curve 501) and histogram B (curve 503). In particular, histogram A (curve 501) shows the normalized number of soft decision output 144 from detected output 137 that have a log-likelihood ratio of −15 (highly unlikely to be correct) is about $10^{-5}$. Each value of the log-likelihood ratio from −14 to 15 increases from about $10^{-5}$ to just less than $10^0$. Similarly, histogram B (curve 503) shows the normalized number of soft decision output 144 from detected output 137 that have a log-likelihood ratio of −15 (highly unlikely to be correct) is about $10^{-4}$. Each value of the log-likelihood ratio from −14 to 15 increases from about $10^{-4}$ to just less than $10^0$. The error rate of the data set corresponding to histogram A (curve 501) is less than that of the data set corresponding to histogram B (curve 503) as evidenced by an increased likelihood of low value soft decision outputs 144 from the data set. Turning to FIG. 5b, a graphical depiction 550 shows an example of a cumulative mass function corresponding to histogram A (curve 551) and a cumulative mass function of histogram B (curve 553).

Using the example histogram A and histogram B, the process of calculating bias values 182 includes: (1) histogram the data received as soft decision outputs 144 to yield histogram A and histogram B, (2) normalize histogram A and histogram B to yield data similar to curve 501 and curve 503, (3) compute a normalized cumulative mass function for the received histogram data, and (4) compute bias values 182 using the calculated cumulative mass function. Normalizing histogram A and histogram B, computing the normalized mass function, and computing bias values 182 may be done in accordance with the following pseudocode:

```
/* (2) normalize histogram A and histogram B */
For (i=1 to Length of Histogram A)
{
    normalized histogram A[i] = (histogram A[i])/(sum of all elements of
      histogram A);
    normalized histogram B[i] = (histogram B)[i]/(sum of all elements of
      histogram B)
}
/*(3) compute a normalized cumulative mass function for the received
histogram data*/
cumulative mass function A (CMFA[1]) = normalized histogram A[1];
cumulative mass function B (CMFB[1]) = normalized histogram B[1];
For (i=2 to Length of Histogram A)
{
    CMFA[i] = CMFA[i-1]+ normalized histogram A[i];
    CMFB[i] = CMFB[i-1]+ normalized histogram B[i]
}
/*(4) compute bias values 182 using the calculated cumulative mass
function */
Length of Biasing Look Up Table 165 (LUT Length) = Length of
Histogram A;
```

-continued

```
Bias Value 182 (LUT[ ]) = Array[LUT Length];
k = 1;
For (i=1 to LUT Length)
{
    if (i==1)
    {
        LUT[i] = 1
    }
    Else
    {
        LUT[i] = LUT[i-1]
    }
    For (j=LUT[i] to Length of Histogram A)
    {
        If (abs_value(CMFA[i]- CMFA[LUT[i]])>
        abs_value(CMFA[i]- CMFA[j]))
        {
            LUT[i]=j
        }
    }
    While (k<=LUT[i])
    {
        Updated Cumulative Mass Function (UCMFA[ ]) =
        CMFA[i];
        k = k+1
    }
}
```

The aforementioned pseudocode assumes that the number of instances in histogram A (i.e., length of histogram A) is the same as that of histogram B. Returning to FIG. 1, at the end of processing, LUT[i] that corresponds to bias values 182 represent the biased relative metric used to replace a corresponding relative metric value such that histogram A is replaced by histogram B. These values are stored to biasing look up table 165. As such, when a value corresponding to one of the values in histogram A is selected by an address 169 (e.g., a log likelihood ratio between −15 and 15 corresponding to one of the elements of histogram A), a corresponding biased relative metric 167 is provided by biasing look up table 165 to soft data biasing circuit 140. In turn, soft data biasing circuit 140 replaces the relative metric with the received bias relative metric. These biased relative metrics are then transformed into the aforementioned updated non-binary metrics.

The calculated bias values 182 are stored to a bias look up table 165. As previously mentioned, non-zero relative metrics are calculated and an address 169 corresponding to the non-zero relative metrics is provided to biasing look up table 165. In response, biasing look up table 165 provides bias values 167 that may be used to degrade the circuit operation to exhibit a higher error rate difference corresponding to that of the two histograms used to calculate bias values 182.

Selector circuit 150 selects between detected output 137 and modified detected output 142 to provide as a selected output 152. The selection between detected output 137 and modified detected output 142 is made based upon a selector input 172 that is controlled by a biasing control circuit 170. In some embodiments of the present invention, biasing control circuit 170 is a programmable register. When selector input 172 is asserted as a logic '1', modified detected output 142 is provided as selected output 152. Alternatively, when selector input 172 is asserted as a logic '0', detected output 137 is provided as selected output 152.

Selected output 152 is provided to a data decoder circuit 155. Data decoder circuit 155 applies a data decoding algorithm to selected output 152 to yield a decoded output 157. Data decoder circuit 155 may be any data decoder circuit known in the art. In one embodiment of the present invention, data decoder circuit 155 is a non-binary low density parity check decoder circuit. Where decoded output 157 fails to converge (i.e., includes errors or differences from an originally written data set), data detector circuit 135 may reprocess the data set used to derive decoded output 157 that is retrieved from buffer circuit 130 as buffered data 132. The reprocessing is done using decoded output 157 as a guide. The combination of applying both the data detection algorithm and the data decoding algorithm is referred to as a global iteration. The process of deriving the original data set may include many global iterations.

Figure 2:
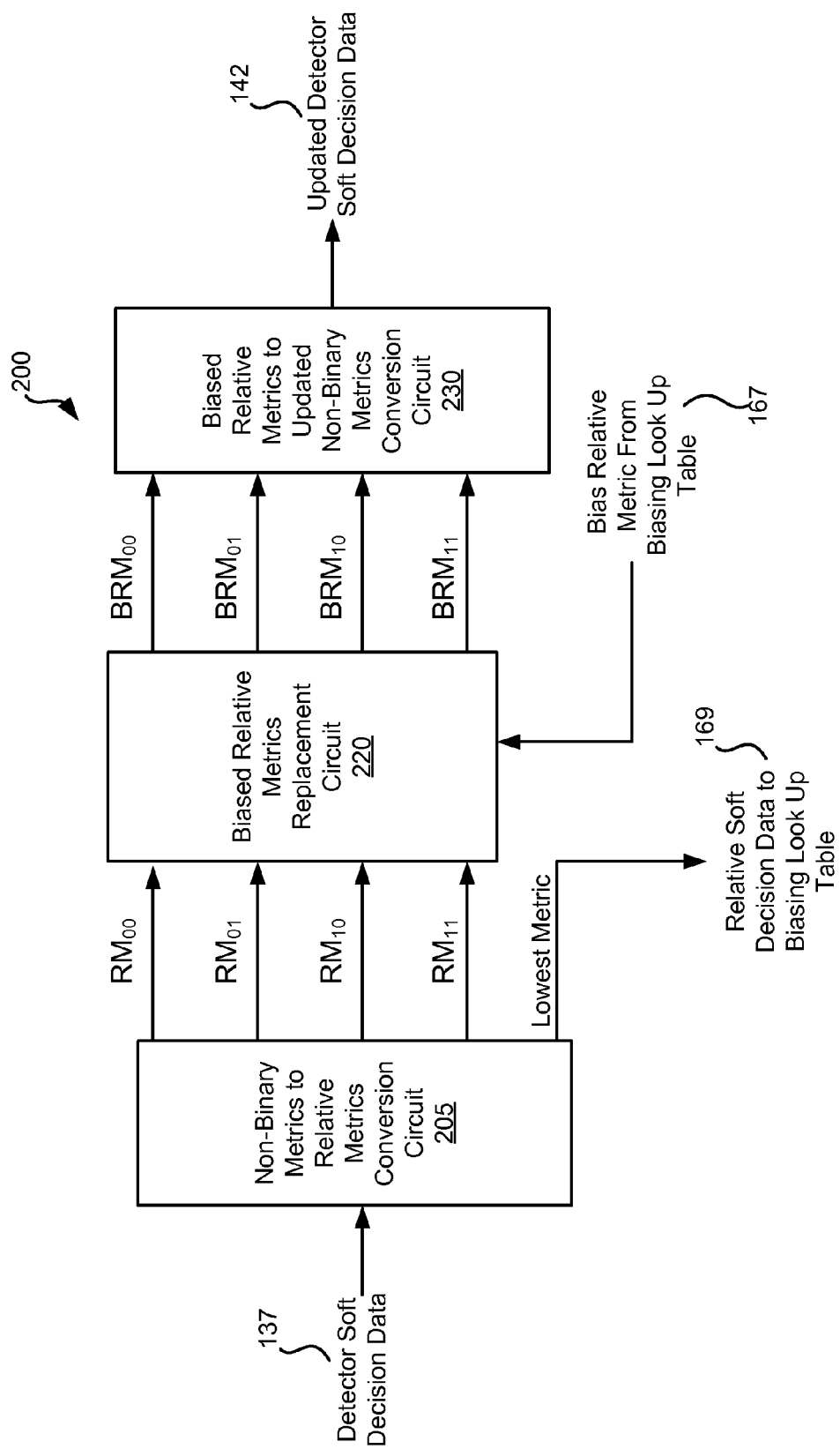
FIG. 2 depicts a soft data biasing circuit that may be used in relation to the data processing circuits described above in relation to FIG. 1.

Turning to FIG. 2, one implementation of a soft data biasing circuit 200 is shown that may be used in place of soft data biasing circuit 140 of FIG. 1. Soft data biasing circuit 200 includes a non-binary metrics to relative metrics conversion circuit 205. The non-binary metrics corresponds to the soft decision data derived from detected output 137. Converting from the non-binary metrics to relative metrics includes calculating relative differences between the received non-binary metrics such that a zero value is assigned to the metric corresponding to the most likely symbol value, and to non-negative metrics are assigned to all other possible symbol values. Using a two-bit, non-binary data processing system as an example where there are four possible symbol values (i.e., 00, 01. 10, 11) and corresponding non-binary metrics (i.e., $M_{00}$, $M_{01}$, $M_{10}$, and $M_{11}$) included in detected output 137, relative metrics ($RM_{00}$, $RM_{01}$, $RM_{10}$, and $RM_{11}$) are calculated in accordance with the following equations:

$$RM_{00}=M_{00}-\text{Reference Metric},$$

$$RM_{01}=M_{01}-\text{Reference Metric},$$

$$RM_{10}=M_{10}-\text{Reference Metric, and}$$

$$RM_{11}=M_{11}-\text{Reference Metric},$$

where the Reference Metric is the metric value corresponding to the true symbol value (i.e., a test pattern) that was written. The metric value corresponding to the true symbol value may be regenerated from memory or using another approach such as accessing the reference metric from a pre-programmed memory.

The aforementioned Lowest Metric is provided by conversion circuit 205 as an address 169 to biasing look up table 165. In return, biasing look up table 165 provides a corresponding biased relative metric 167. Biased relative metric 167 is provided to a biased relative metrics replacement circuit 220. Biased relative metrics replacement circuit 220 replaces non-zero relative metrics (three of $RM_{00}$, $RM_{01}$, $RM_{10}$, and $RM_{11}$) with respective values received as biased relative metrics (three of $BRM_{00}$, $BRM_{01}$, $BRM_{10}$, and $BRM_{11}$). In some cases, biased relative metric 167 is a single biased relative metric that is used to replace the three non-zero relative metrics. In other cases, biased relative metric 167 is three values used to replace corresponding to the three non-zero relative metrics.

The biased relative metrics ($BRM_{00}$, $BRM_{01}$, $BRM_{10}$, $BRM_{11}$) are provided to a biased relative metrics to updated non-binary metrics conversion circuit 230. Conversion circuit 230 performs substantially the inverse conversion of that performed by conversion circuit 205. Using the same two-bit, non-binary data processing system as an example, updated non-binary metrics (i.e., $UNBM_{00}$, $UNBM_{01}$, $UBM_{10}$, and $UNBM_{11}$) are calculated from the biased relative metrics (i.e., $BRM_{00}$, $BRM_{01}$, $BRM_{10}$, and $BRM_{11}$) in accordance with the following equations:

$UNBM_{00} = BRM_{00}$-Minimum Relative Metric, $UNBM_{01} = BRM_{01}$-Minimum Relative Metric, $UNBM_{10} = BRM_{10}$-Minimum Relative Metric, and $UNBM_{11} = BRM_{11}$-Minimum Relative Metric, where the Minimum Relative Metric is the biased relative metric ($BRM_{00}$, $BRM_{01}$, $BRM_{10}$, and $BRM_{11}$) that has the lowest value. The updated non-biased metrics are provided as part of modified detected output 142. It should be noted that while the example of soft biasing circuit 200 is a two-bit example that the same approach may be expanded for application to non-binary data processing systems operating on symbols including three or more bits per symbol.

Figure 3:
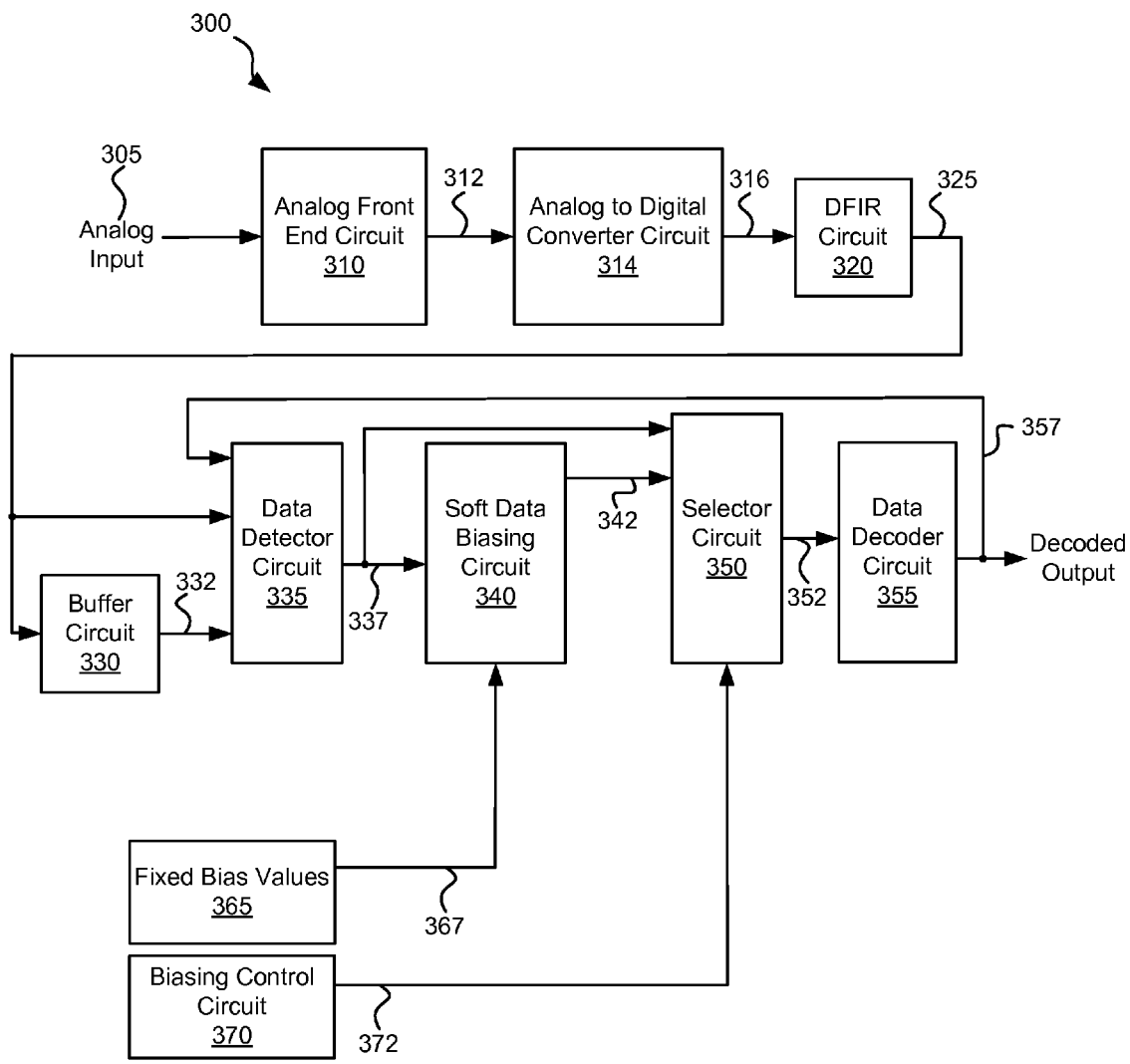
FIG. 3 depicts another data processing circuit including selectable operation degrading circuitry in accordance in some embodiments of the present invention.

Turning to FIG. 3, another data processing circuit 300 including selectable operation degrading circuitry is shown in accordance in some embodiments of the present invention. The fundamental difference between data processing circuit 100 and data processing circuit 300 is that data processing circuit 300 uses a fixed or programmable biased value compared to the adaptive bias value generated by data processing circuit 100. In some cases, the fixed or programmable bias value used in data processing circuit may be calculated using the same histogram based approach discussed above in relation to FIG. 1, but is not adaptively updated. In other cases, the fixed or programmable bias value is calculated or selected using another approach.

Data processing circuit 300 includes an analog front end circuit 310 that receives an analog input 305 and provides a processed analog signal 312. Analog front end circuit 310 may be any analog processing circuit known in the art. In one particular embodiment of the present invention, analog front end circuit 310 includes an amplifier circuit and a continuous time filter (i.e., an analog filter) that operate to amplify and noise filter the received input to yield processed analog signal 312. Analog signal 305 may be derived from a variety of sources including, but not limited to, a storage medium or a transfer medium. Based upon the disclosure provided herein, one of ordinary skill in the art will recognize a variety of sources from which analog input signal 305 may be derived.

Processed analog signal 312 is provided to an analog to digital converter circuit 314 that samples processed analog signal 312 to yield a corresponding series of digital samples 316. Analog to digital converter circuit 314 may be any circuit known in the art that is capable of converting a continuous time signal to a series of digital values. Digital samples 316 are provided to an equalizer circuit 320 that may be implemented as a digital finite impulse response circuit as are known in the art. Equalizer circuit 320 performs an equalization on digital samples 316 to yield an equalized output 325. Based upon the disclosure provided herein, one of ordinary skill in the art will recognize a variety of equalizer circuits that may be used in relation to different embodiments of the present invention.

Equalized output 325 is provided to a data detector circuit 335 and to a buffer circuit 330. Data detector circuit 335 applies a data detection algorithm to equalized output 325 to yield a detected output 337. Data detector circuit 335 may be any data detector circuit known in the art including, but not limited to, a Viterbi algorithm data detector circuit or a maximum a posteriori data detector circuit. In some cases, detected output 337 includes both hard decision data and soft decision data. As used herein, the phrase "hard decision data" refers to a data output that indicates a certain logic level for a given bit period or bit periods. For example, in a binary system, the logic level may be a '1' or a '0'. As another example, in a two bit binary system, the logic level may be "00', '01', '10' or '11'. Based upon the disclosure provided herein, one of ordinary skill in the art will recognize a variety of hard decision data that may be produced by a data detector circuit. As used herein, the phrase "soft decision data" refers to a data output that indicates a likelihood that data detector circuit 335 correctly detected data for the bit period or bit periods. In one particular embodiment of the present invention, soft decision data ranges from negative fifteen (−15) to positive fifteen (+15) with −15 indicating that the decision is highly unlikely to be correct and +15 indicating that the decision is highly likely to be correct. The increasing values from −14 to +14 correspond to a corresponding increase in the likelihood that the decision was correct. Based upon the disclosure provided herein, one of ordinary skill in the art will recognize a variety of values and ranges that may be used to represent the soft decision data.

In a non-binary data processing system, groups of symbols are processed together. For example, in a two bit, non-binary data processing system groups of two bit symbols are processed together with the groups of two bit symbols being capable of representing four possible outputs (i.e., 00, 01, 10, 11). In such systems, metrics (i.e., Euclidean distances) are calculated for each of the possible symbol values. In the case of two bit symbols, four metrics are calculated. A large metric value indicates that the corresponding symbol value is unlikely, and a small metric indicates a higher degree of likelihood. A symbol is in error when the correctly selected symbol value does not correspond to the smallest of the metrics. In contrast, a symbol is determined to be correct when the correctly selected symbol value corresponds to the smallest of the metrics. The later discussed decoding algorithm processes the multiple metrics to correct any errors. Detected output 337 includes the metrics for each of the possible values for the symbol values as soft data decisions, and may or may not include the symbol value corresponding to the smallest metric.

Detected output 337 is provided to both a soft data biasing circuit 340 and a selector circuit 350. Soft data biasing circuit 340 is operable to bias the soft decision data included in detected output 337 to yield a modified detected output 342. In particular, the soft decision data from detected output 337 is converted from non-binary metrics to relative metrics, biased by applying noise biasing to the relative metrics to yield biased relative metrics, and the biased relative metrics converted back into non-binary metrics (i.e., updated binary metrics).

Converting from the non-binary metrics to relative metrics includes calculating relative differences between the received non-binary metrics such that a zero value is assigned to the metric corresponding to the most likely symbol value, and to non-negative metrics are assigned to all other possible symbol values. Using a two-bit, non-binary data processing system as an example where there are four possible symbol values (i.e., 00, 01. 10, 11) and corresponding non-binary metrics (i.e., $M_{00}$, $M_{01}$, $M_{10}$, and $M_{11}$) included in detected output 137, relative metrics ($RM_{00}$, $RM_{01}$, $RM_{10}$, and $RM_{11}$) are calculated in accordance with the following equations:

$RM_{00} = M_{00}$-Reference Metric, $RM_{01} = M_{01}$-Reference Metric, $RM_{10} = M_{10}$-Reference Metric, and $RM_{11} = M_{11}$-Reference Metric, where the Reference Metric is the metric value corresponding to the true symbol value (i.e., a test pattern) that was written. The metric value corresponding to the true symbol value may be regenerated from memory or using another approach such as accessing the reference metric from a pre-programmed memory.

As will be appreciated, the relative metric corresponding to the correct symbol value is zero where it was properly selected. Thus, for each of the incorrect symbol values (i.e., the symbol values that do not correspond to the Lowest Metric), if the corresponding relative metric is positive, application of the data detection algorithm is correctly selecting the appropriate symbol value. Conversely, if any of the relative metrics is negative, application of the data detection algorithm is not correctly selecting the appropriate symbol value.

Soft data biasing circuit 340 biases the non-zero relative metrics to yield biased relative metrics. This may be done in a way that distorts detected output 337 such that the errors resulting from the distortion is predictably related to the number of errors that would result where no distortion is applied. By predictably degrading the operation of data processing circuit 300, the time required to generate a sufficient number of errors to characterize a system in which data processing circuit 300 is deployed is decreased, and because the number of errors corresponding from the degraded operation is predictably related to an actual number of errors, the characterization represents the actual operation of the system. In some cases, all of the non-zero relative metrics are multiplied by the same fixed bias value. In other cases, all of the non-zero relative metrics are multiplied by the same bias value that is selected based upon one or a combination of the non-zero relative metrics. In yet other cases, each of the non-zero relative metrics is multiplied by a respective bias value selected based on the corresponding relative metric. In cases where individual bias values are used, the bias value may be selected based upon both the value of the relative metric and the proximity to zero (i.e., whether it is the closest to zero, the second closest to zero, or the third closest to zero).

It has been determined that the errors are mostly related to the most likely symbol (with a small relative metric value), and the biasing function for the other less likely symbol values is less relevant to error correction performance. Because of this, the same bias value may be applied to all of the non-zero relative metrics in an effort to save hardware complexity. In other cases, the bias values may be selected based upon the correctly selected symbol value (i.e., the lowest relative metric value) as in a magnetic based storage device there is intrinsically more noise with transitioning symbols (e.g., '01' and '10') compared with non-transitioning symbols (e.g., '11' and '00') due to the nature of magnetic recording physics.

In some embodiments of the present invention, the biasing is done by multiplying the relative metrics calculated by soft data biasing circuit 340 by a bias value 367 to yield respective biased relative metrics (BRM). Bias value 367 is provided by a fixed bias values register 365 that may be either programmable or hardwired depending upon the particular implementation. Soft data biasing circuit 340 then converts the biased relative metrics back into non-binary metrics using a process that is substantially the inverse of the previously described conversion from the non-binary metrics into the relative metrics. Using the same two-bit, non-binary data processing system as an example, updated non-binary metrics (i.e., $UNBM_{00}$, $UNBM_{01}$, $UBM_{10}$, and $UNBM_{11}$) are calculated from the biased relative metrics (i.e., $BRM_{00}$, $BRM_{01}$, $BRM_{10}$, and $BRM_{11}$) in accordance with the following equations:

$UNBM_{00} = BRM_{00} -$ Minimum Relative Metric, $UNBM_{01} = BRM_{01} -$ Minimum Relative Metric, $UNBM_{10} = BRM_{10} -$ Minimum Relative Metric, and $UNBM_{11} = BRM_{11} -$ Minimum Relative Metric, where the Minimum Relative Metric is the biased relative metric ($BRM_{00}$, $BRM_{01}$, $BRM_{10}$, and $BRM_{11}$) that has the lowest value. The updated non-biased metrics are provided as part of modified detected output 342. It should be noted that while the example of soft biasing circuit 340 is a two-bit example that the same approach may be expanded for application to non-binary data processing systems operating on symbols including three or more bits per symbol.

Selector circuit 350 selects between detected output 337 and modified detected output 142 to provide as a selected output 352. The selection between detected output 337 and modified detected output 342 is made based upon a selector input 372 that is controlled by a biasing control circuit 370. In some embodiments of the present invention, biasing control circuit 370 is a programmable register. When selector input 372 is asserted as a logic '1', modified detected output 342 is provided as selected output 352. Alternatively, when selector input 372 is asserted as a logic '0', detected output 337 is provided as selected output 352.

Selected output 352 is provided to a data decoder circuit 355. Data decoder circuit 355 applies a data decoding algorithm to selected output 352 to yield a decoded output 357. Data decoder circuit 355 may be any data decoder circuit known in the art. In one embodiment of the present invention, data decoder circuit 355 is a non-binary low density parity check decoder circuit. Where decoded output 357 fails to converge (i.e., includes errors or differences from an originally written data set), data detector circuit 335 may reprocess the data set used to derive decoded output 357 that is retrieved from buffer circuit 330 as buffered data 332. The reprocessing is done using decoded output 357 as a guide. The combination of applying both the data detection algorithm and the data decoding algorithm is referred to as a global iteration. The process of deriving the original data set may include many global iterations.

Figure 4:
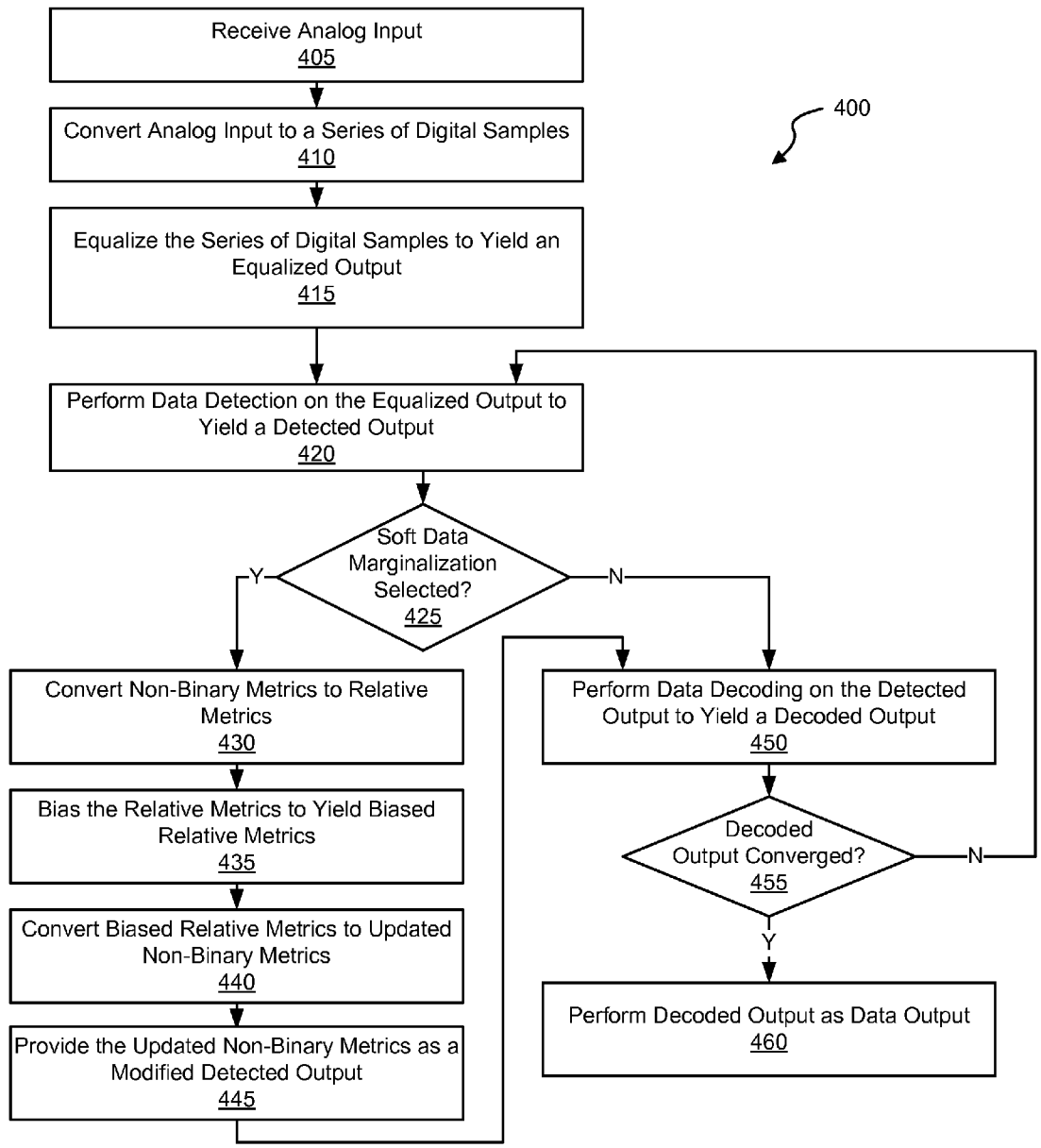
FIG. 4 is a flow diagram showing a method for selectable soft data biasing in accordance with some embodiments of the present invention.

Turning to FIG. 4, a flow diagram 400 shows a method for selectable soft data biasing in accordance with some embodiments of the present invention. Following flow diagram 400, an analog input is received (block 405). The analog input may correspond to information maintained on a storage medium. The analog input is converted to a series of digital samples (block 410). The analog to digital conversion process may be any process known in the art for converting an analog signal to corresponding digital samples. A data equalization process is then applied to the digital samples to yield an equalized output (block 415). In some embodiments of the present invention, the equalization process is performed by one or more digital finite impulse filters. Based upon the disclosure provided herein, one of ordinary skill in the art will recognize a variety of equalization methods that may be used in relation to different embodiments of the present invention.

Data detection is performed on the equalized output (block 420). The data processing may include, but is not limited to, applying a data detection algorithm to the equalized output to yield a detected output. In one embodiment, the data detection process is a Viterbi algorithm detection process or a maximum a posteriori detection process as are known in the art. The detected output may include both hard decision data and soft decision data. Based upon the disclosure provided herein, one of ordinary skill in the art will recognize a variety of data detection processes and/or algorithms that can be used in relation to different embodiments of the present invention.

It is determined whether soft data marginalization is selected (block 425). Such soft data marginalization may be selected to predictably increase the number of errors resulting from data processing. By predictably increasing the number of errors resulting from data processing, the time required to generate a sufficient number of errors to characterize a system in which the process is deployed is decreased. Because the number of errors corresponding from the marginalized operation is predictably related to an actual number of errors, the characterization represents the actual operation of the system.

Where soft data marginalization is selected (block 425), the non-binary metrics included as the soft decision data of the detected output are converted to relative metrics (block 430). Converting from the non-binary metrics to relative metrics includes calculating relative differences between the received non-binary metrics such that a zero value is assigned to the metric corresponding to the most likely symbol value, and to non-negative metrics are assigned to all other possible symbol values. Using a two-bit, non-binary data processing system as an example where there are four possible symbol values (i.e., 00, 01. 10, 11) and corresponding non-binary metrics (i.e., $M_{00}$, $M_{01}$, $M_{10}$, and $M_{11}$) included in detected output 137, relative metrics ($RM_{00}$, $RM_{01}$, $RM_{10}$, and $RM_{11}$) are calculated in accordance with the following equations:

$RM_{00} = M_{00} - \text{Reference Metric}$, $RM_{01} = M_{01} - \text{Reference Metric}$, $RM_{10} = M_{10} - \text{Reference Metric, and}$ $RM_{11} = M_{11} - \text{Reference Metric}$, where the Reference Metric is the metric value corresponding to the true symbol value (i.e., a test pattern) that was written. The metric value corresponding to the true symbol value may be regenerated from memory or using another approach such as accessing the reference metric from a pre-programmed memory.

The relative metrics are then biased to yield biased relative metrics ($BRM_{00}$, $BRM_{01}$, $BRM_{10}$, and $BRM_{11}$) (block 435). This may be done, for example, by accessing a biasing look up table based upon one of the non-zero relative metrics as discussed above in relation to FIG. 1. In other cases, biasing may be done by multiplying each of the relative metrics by a bias value in accordance with the following equations:

$BRM_{00} = (\text{BiasValue})*(RM_{00})$, $BRM_{01} = (\text{BiasValue})*(RM_{01})$, $BRM_{10} = (\text{BiasValue})*(RM_{10})$, and $BRM_{11} = (\text{BiasValue})*(RM_{11})$.

The bias value may be a fixed or programmable value similar to that discussed above in relation to FIG. 3.

It should be noticed that other approaches may be used to apply the bias. For example, in other embodiments of the present invention, biasing may be done by subtracting the bias value from the corresponding relative metric in accordance with the following equations:

$BRM_{00} = RM_{00} - \text{BiasValue}$, $BRM_{01} = RM_{01} - \text{BiasValue}$, $BRM_{10} = RM_{10} - \text{BiasValue}$, and $BRM_{11} = RM_{11} - \text{BiasValue}$.

Based upon the disclosure provided herein, one of ordinary skill in the art will recognize other approaches for applying bias that may be used in relation to different embodiments of the present invention.

The biased relative metrics are then converted to updated non-binary metrics ($UNBM_{00}$, $UNBM_{01}$, $UBM_{10}$, and $UNBM_{11}$) (block 440). Using the same two-bit, non-binary data processing system as an example, updated non-binary metrics (i.e., $UNBM_{00}$, $UNBM_{01}$, $UBM_{10}$, and $UNBM_{11}$) are calculated from the biased relative metrics (i.e., $BRM_{00}$, $BRM_{01}$, $BRM_{10}$, and $BRM_1$) in accordance with the following equations:

$UNBM_{00} = BRM_{00} - \text{Minimum Relative Metric}$, $UNBM_{01} = BRM_{01} - \text{Minimum Relative Metric}$, $UNBM_{10} = BRM_{10} - \text{Minimum Relative Metric, and}$ $UNBM_{11} = BRM_{11} - \text{Minimum Relative Metric}$, where the Minimum Relative Metric is the biased relative metric ($BRM_{00}$, $BRM_{01}$, $BRM_{10}$, and $BRM_{11}$) that has the lowest value. The updated non-biased metrics are provided as part of a modified detected output (block 445). It should be noted that while the process of flow diagram 400 is explained using a two bit symbol example that the same approach may be expanded for application to non-binary data processing systems operating on symbols including three or more bits per symbol.

Where either soft data marginalization is not selected (block 425) or the marginalization process has completed (blocks 430-445), standard processing of the detected output (block 420) is performed. In particular a data decoding algorithm is applied to the detected output to yield a decoded output (block 450). The decoding algorithm may be, for example, a non-binary low density parity check algorithm as are known in the art. Based upon the disclosure provided herein, one of ordinary skill in the art will recognize a variety of decoding algorithms that may be applied in relation to different embodiments of the present invention. It is determined whether the decoded output converged (i.e., resulted in a correct identification of the originally written data) (block 455). Where the decoded output converged (block 455), the decoded output is provided as a data output (block 460). Alternatively, where the decoded output failed to converge (block 455), a subsequent data detection process is applied using the decoded output as a guide (block 420).

Figure 6:
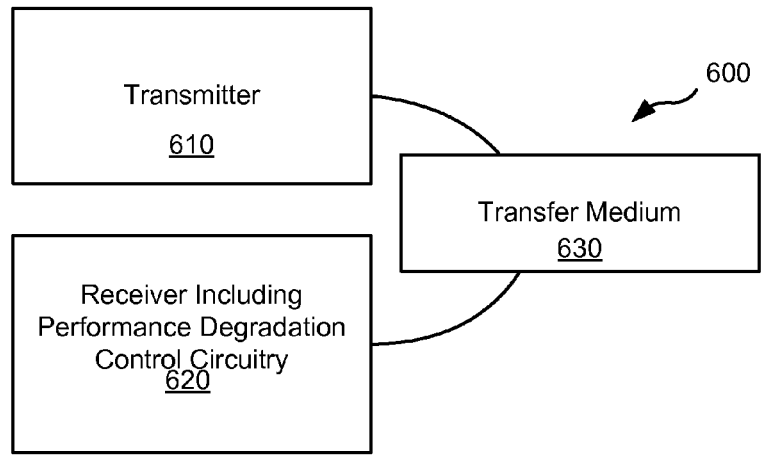
FIG. 6 shows a data transmission system including a receiver with performance degradation control circuitry in accordance with one or more embodiments of the present invention.

Turning to FIG. 6, a data transmission system 600 including a receiver 620 having noise injection circuitry is shown in accordance with some embodiments of the present invention. Data transmission system 600 includes a transmitter 610 that is operable to transmit encoded information via a transfer medium 630 as is known in the art. The encoded data is received from transfer medium 630 by receiver 620. Receiver 620 incorporates performance degradation control circuitry that may be implemented similar to that discussed above in relation to FIG. 1, FIG. 2, or FIG. 3 and/or operate similar to that described above in relation to FIG. 4.

Figure 7:
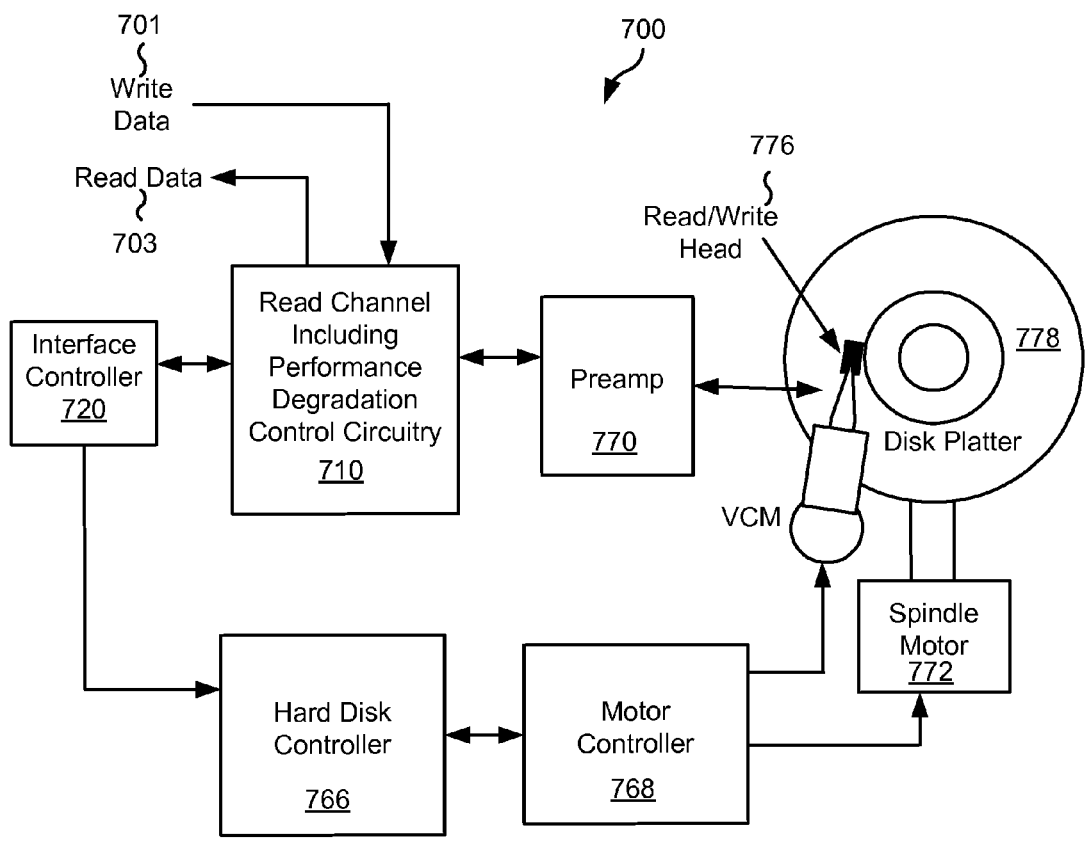
FIG. 7 shows a storage system including a read channel with performance degradation control circuitry in accordance with one or more embodiments of the present invention.

FIG. 7 shows a storage system 700 including a read channel circuit 710 with performance degradation control circuitry in accordance with some embodiments of the present invention. Storage system 700 may be, for example, a hard disk drive. Storage system 700 also includes a preamplifier 770, an interface controller 720, a hard disk controller 766, a motor controller 768, a spindle motor 772, a disk platter 778, and a read/write head assembly 776. Interface controller 720 controls addressing and timing of data to/from disk platter 778. The data on disk platter 778 consists of groups of magnetic signals that may be detected by read/write head assembly 776 when the assembly is properly positioned over disk platter 778. In one embodiment, disk platter 778 includes magnetic signals recorded in accordance with either a longitudinal or a perpendicular recording scheme.

In a typical read operation, read/write head assembly 776 is accurately positioned by motor controller 768 over a desired data track on disk platter 778. Motor controller 768 both positions read/write head assembly 776 in relation to disk platter 778 and drives spindle motor 772 by moving read/write head assembly to the proper data track on disk platter 778 under the direction of hard disk controller 766. Spindle motor 772 spins disk platter 778 at a determined spin rate (RPMs). Once read/write head assembly 778 is positioned adjacent the proper data track, magnetic signals representing data on disk platter 778 are sensed by read/write head assembly 776 as disk platter 778 is rotated by spindle motor 772. The sensed magnetic signals are provided as a continuous, minute analog signal representative of the magnetic data on disk platter 778. This minute analog signal is transferred from read/write head assembly 776 to read channel circuit 710 via preamplifier 770. Preamplifier 770 is operable to amplify the minute analog signals accessed from disk platter 778. In turn, read channel circuit 710 decodes and digitizes the received analog signal to recreate the information originally written to disk platter 778. This data is provided as read data 703 to a receiving circuit. A write operation is substantially the opposite of the preceding read operation with write data 701 being provided to read channel circuit 710. This data is then encoded and written to disk platter 778.

During one or more set up periods, the included performance degradation control circuitry degrades circuit operation to incur a number of otherwise unexpected errors. During this process, soft data is modified to negatively impact circuit performance in a controlled way. As just one of many advantages, the ability to controllably induce errors allows for faster device characterization than is possible where a normal error rate occurs. Such performance degradation may be done during manufacture, and/or may be done once storage device 700 is deployed. The performance degradation control circuitry may be implemented similar to that discussed above in relation to FIG. 1, FIG. 2 or FIG. 3 and/or operate similar to that described above in relation to FIG. 4.

It should be noted that storage system 700 may be integrated into a larger storage system such as, for example, a RAID (redundant array of inexpensive disks or redundant array of independent disks) based storage system. It should also be noted that various functions or blocks of storage system 700 may be implemented in either software or firmware, while other functions or blocks are implemented in hardware.

Figure 8:
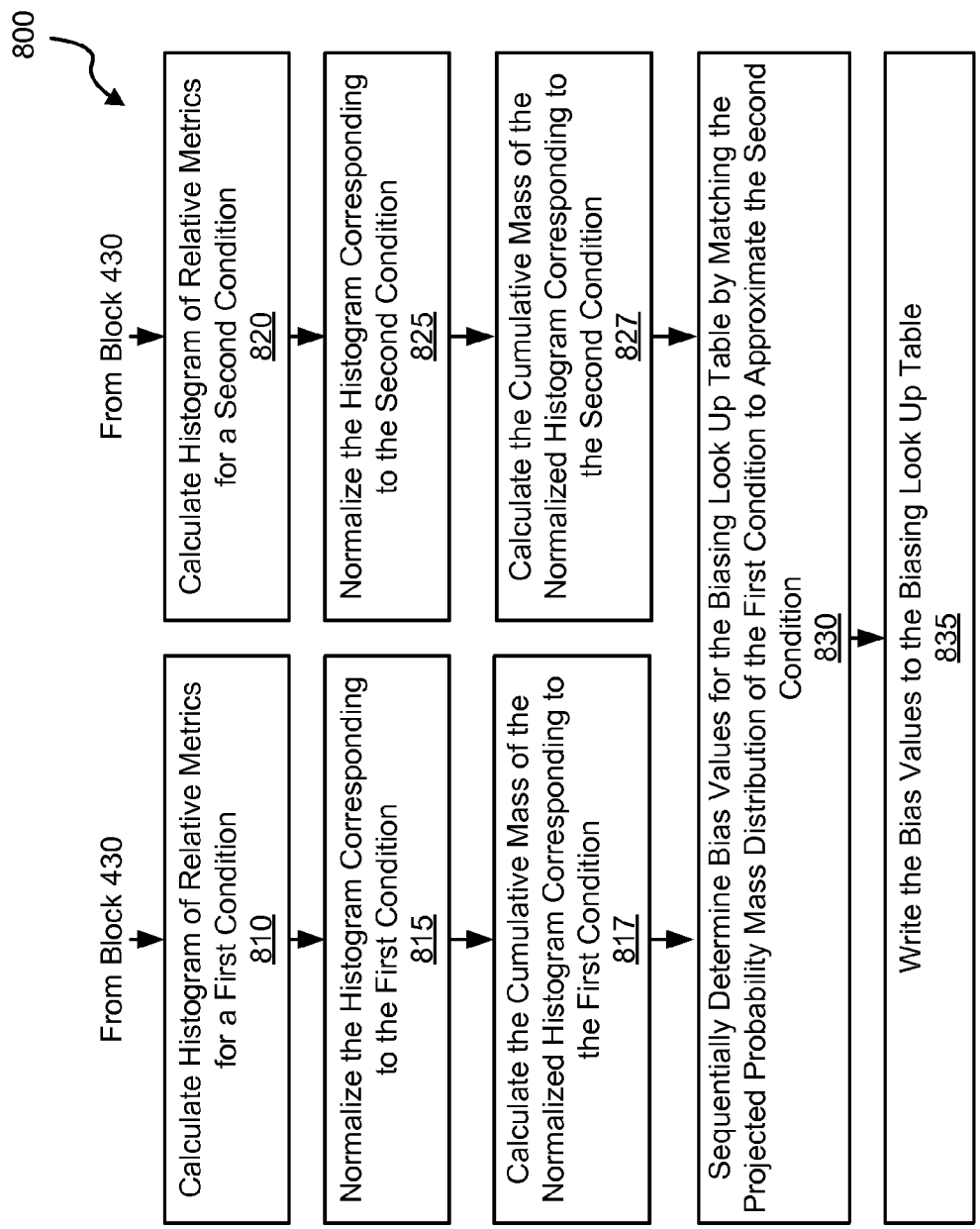
FIG. 8 is a flow diagram showing a method for determining degradation factors or bias values in accordance with some embodiments of the present invention.

Turning to FIG. 8, a flow diagram 800 shows a method for determining degradation factors or bias values in accordance with some embodiments of the present invention. Following flow diagram 800, relative metrics are received from block 430 of FIG. 4. These relative metrics are converted soft decision data indicating a likelihood that a given symbol value would be correct. A histogram of relative metrics corresponding to a first condition is calculated (block 810). The first condition is a first data set (i.e., series of values) that when processed yield a first error rate. The histogram corresponding to the first condition (block 810) is normalized (block 815). This normalization may be done in accordance with the following pseudocode:

```
/* normalize histogram A */
For (i=1 to Length of Histogram A)
{
    normalized histogram A[i] = (histogram A[i])/(sum of all elements of histogram A)
}
```

Histogram A corresponds to the histogram of the first condition. The cumulative mass of the histogram of the first condition is calculated (block 817). This calculation may be done in accordance with the following pseudocode:

```
/*compute a normalized cumulative mass function for the received histogram data*/
cumulative mass function A (CMFA[1]) = normalized histogram A[1];
For (i=2 to Length of Histogram A)
{
    CMFA[i] = CMFA[i-1]+ normalized histogram A[i];
}
```

The same process is performed for a data set of a second condition (i.e., a second error rate). In particular, a histogram of relative metrics corresponding to a second condition is calculated (block 820). The second condition is a second data set (i.e., series of values) that when processed yield a second error rate. The histogram corresponding to the second condition (block 820) is normalized (block 825). This normalization may be done in accordance with the following pseudocode:

```
/* normalize histogram B */
For (i=1 to Length of Histogram B)
{
    normalized histogram B[i] = (histogram B[i])/(sum of all elements of histogram B)
}
```

Histogram B corresponds to the histogram of the second condition. The cumulative mass of the histogram of the second condition is calculated (block 827). This calculation may be done in accordance with the following pseudocode:

```
/*compute a normalized cumulative mass function for the received histogram data*/
cumulative mass function B (CMFB[1]) = normalized histogram B[1];
For (i=2 to Length of Histogram B)
{
    CMFB[i] = CMFB[i-1]+ normalized histogram B[i];
}
```

Bias values for converting between the first condition and the second condition are sequentially determined (block 830). These bias values may be used to predictably degrade data processing operation as discussed above in relation to FIG. 4, and in particular are the bias values used in block 435 of FIG. 4. In some embodiments, determining the bias values is done in accordance with the following pseudocode:

```
/*compute bias values using the calculated cumulative mass function */
Length of Biasing Look Up Table (LUT Length) = Length of
Histogram A;
Bias Value (LUT[ ]) = Array[LUT Length];
k = 1;
For (i=1 to LUT Length)
{
    if (i==1)
    {
        LUT[i] = 1
    }
    Else
    {
        LUT[i] = LUT[i-1]
    }
    For (j=LUT[i] to Length of Histogram A)
    {
        If (abs_value(CMFA[i]- CMFA[LUT[i]])>
        abs_value(CMFA[i]- CMFA[j])
        {
            LUT[i]=j
        }
    }
    While (k<=LUT[i])
    {
        Updated Cumulative Mass Function (UCMFA[ ]) =
        CMFA[i];
        k = k+1
    }
}
```

The calculated bias values (LUT[ ]) are then stored to a biasing look up table from which they may be accessed for use in biasing (block 835).

Figure 9:
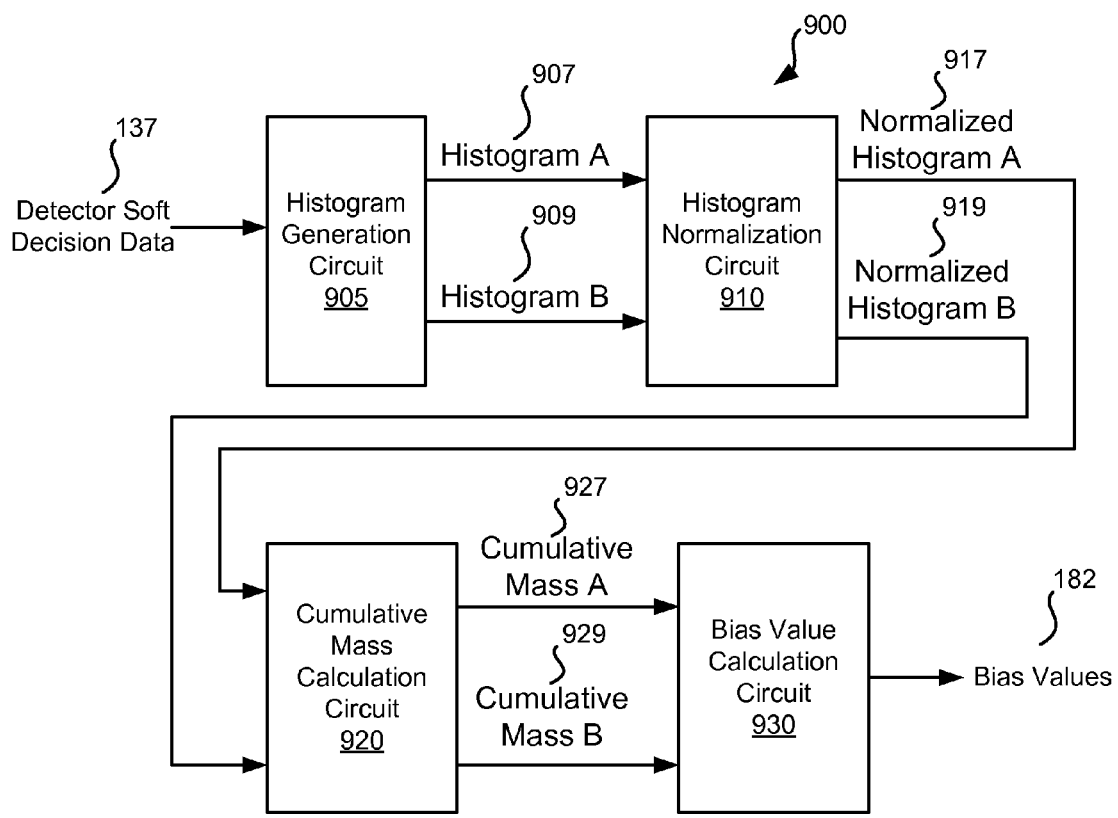
FIG. 9 depicts a histogram based bias value calculation circuit in accordance with various embodiments of the present invention.

Turning to FIG. 9, a histogram based bias value calculation circuit 900 is shown in accordance with various embodiments of the present invention. Histogram based bias value calculation circuit 900 includes a histogram generation circuit 905. Histogram generation circuit 905 receives soft decision data from detected output 137, and generates a histogram A 907 covering each value of the soft decision data for one data set, and a histogram B 909 covering each value of the soft decision data for another data set. Histogram A 907 and histogram B 909 are provided to a histogram normalization circuit 910 that normalizes both of the received histograms to yield a normalized histogram A 917 and a normalized histogram B 919. In some embodiments, the normalized histograms are calculated in accordance with the following pseudocode:

```
/* normalize histogram A and histogram B */
For (i=1 to Length of Histogram A)
{
    normalized histogram A[i] = (histogram A[i])/(sum of all elements of
    histogram A);
    normalized histogram B[i] = (histogram B)[i]/(sum of all elements of
    histogram B)
}
```

Normalized histogram A 917 and a normalized histogram B 919 are provided to a cumulative mass calculation circuit 920 that calculates a cumulative mass A 927 of normalized histogram A 917, and a cumulative mass B 929 of normalized histogram B 919. In some embodiments, the cumulative mass calculations are performed in accordance with the following pseudocode:

```
/* compute a normalized cumulative mass function for the received
histogram data*/
cumulative mass function A (CMFA[1]) = normalized histogram A[1];
cumulative mass function B (CMFB[1]) = normalized histogram B[1];
For (i=2 to Length of Histogram A)
{
    CMFA[i] = CMFA[i-1]+ normalized histogram A[i];
    CMFB[i] = CMFB[i-1]+ normalized histogram B[i]
}
```

Cumulative mass A 927 and Cumulative mass B 929 are provided to a bias value calculation circuit 930 that calculates bias values 182. In some embodiments, the bias values are calculated in accordance with the following pseudocode:

```
/* compute bias values 182 using the calculated cumulative mass
function */
Length of Biasing Look Up Table (LUT Length) = Length of
Histogram A;
Bias Value 182 (LUT[ ]) = Array[LUT Length];
k = 1;
For (i=1 to LUT Length)
{
    if (i==1)
    {
        LUT[i] = 1
    }
    Else
    {
        LUT[i] = LUT[i-1]
    }
    For (j=LUT[i] to Length of Histogram A)
    {
        If (abs_value(CMFA[i]- CMFA[LUT[i]])>
        abs_value(CMFA[i]- CMFA[j])
        {
            LUT[i]=j
        }
    }
    While (k<=LUT[i])
    {
        Updated Cumulative Mass Function (UCMFA[ ]) =
        CMFA[i];
        k = k+1
    }
}
```

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing circuit, the circuit comprising:
a data detector circuit operable to apply a data detection algorithm to a first data set to yield a first series of soft decision data, and to apply the data detection algorithm to a second data set to yield a second series of soft decision data; and
a bias calculation circuit operable to calculate a series of bias values based at least in part on the first series of soft decision data and the second series of soft decision data, wherein the series of bias values correspond to a modification from an error rate corresponding to the first series of soft decision data to an error rate corresponding to the second series of soft decision data.

2. The data processing circuit of claim 1, wherein the data detection algorithm is selected from a group consisting of: a maximum a posteriori data detection algorithm and a Viterbi data detection algorithm.

3. The data processing circuit of claim 1, wherein the bias calculation circuit comprises:
a histogram calculation circuit operable to generate a first histogram of the values of the first series of soft decision data, and to generate a second histogram of the values of the second series of soft decision data.

4. The data processing circuit of claim 3, wherein the bias calculation circuit further comprises:
a histogram normalizing circuit operable to normalize the first histogram to yield a first normalized histogram, and to normalize the second histogram to yield a second normalized histogram.

5. The data processing circuit of claim 4, wherein the histogram normalizing circuit is operable to divide the number of instances of each value of the first series of soft decision data in the first histogram by a sum of the number of instances of all values of the first series of soft decision data in the first histogram, and to divide the number of instances of each value of the second series of soft decision data in the second histogram by a sum of the number of instances of all values of the second series of soft decision data in the second histogram.

6. The data processing circuit of claim 4, wherein the bias calculation circuit further comprises:
a cumulative mass calculation circuit operable to calculate a first cumulative mass of the first normalized histogram, and to calculate a second cumulative mass of the second normalized histogram.

7. The data processing circuit of claim 6, wherein the cumulative mass calculation circuit is operable to, for each value of the first series of soft decision data in the first histogram, sum the number of instances of each value of the first series of soft decision data in the first histogram less than a current value of the first series of soft decision data in the first histogram, and to, for each value of the second series of soft decision data in the second histogram, sum the number of instances of each value of the second series of soft decision data in the second histogram less than a current value of the second series of soft decision data in the second histogram.

8. The data processing circuit of claim 6, wherein the bias calculation circuit further comprises:
a bias value calculation circuit operable to calculate the series of bias values based at least in part on the first cumulative mass and the second cumulative mass.

9. The data processing circuit of claim 1, wherein the data processing circuit further comprises:
a memory operable to store the bias values.

10. The data processing circuit of claim 1, wherein the data processing circuit is implemented in an integrated circuit.

11. The data processing circuit of claim 1, wherein the data processing circuit is implemented in a storage device.

12. A method for generating bias values to predictably increasing an error rate of a data processing circuit, the method comprising:
receiving a first data set;
applying a data detection algorithm by a data detector circuit to the first data set to yield a first series of soft decision data;
receiving a second data set;
applying the data detection algorithm by the data detector circuit to the second data set to yield a second series of soft decision data;
calculating a series of bias values based at least in part on the first series of soft decision data and the second series of soft decision data, wherein the series of bias values correspond to a modification from an error rate corresponding to the first series of soft decision data to an error rate corresponding to the second series of soft decision data.

13. The method of claim 12, wherein calculating the series of bias values comprises:
generating a first histogram of the values of the first series of soft decision data; and
generating a second histogram of the values of the second series of soft decision data.

14. The method of claim 13, wherein calculating the series of bias values further comprises:
calculating a first normalized histogram based on the first histogram; and
calculating a second normalized histogram based on the second histogram.

15. The method of claim 14, wherein:
calculating the first normalized histogram includes dividing the number of instances of each value of the first series of soft decision data in the first histogram by a sum of the number of instances of all values of the first series of soft decision data in the first histogram; and
calculating the second normalized histogram includes dividing the number of instances of each value of the second series of soft decision data in the second histogram by a sum of the number of instances of all values of the second series of soft decision data in the second histogram.

16. The method of claim 14, wherein calculating the series of bias values further comprises:
calculating a first cumulative mass of the first normalized histogram; and
calculating a second cumulative mass of the second normalized histogram.

17. The method of claim 16, where:
calculating the first cumulative mass includes, for each value of the first series of soft decision data in the first histogram, sum the number of instances of each value of the first series of soft decision data in the first histogram less than a current value of the first series of soft decision data in the first histogram; and
calculating the second cumulative mass includes, for each value of the second series of soft decision data in the second histogram, sum the number of instances of each value of the second series of soft decision data in the second histogram less than a current value of the second series of soft decision data in the second histogram.

18. The method of claim 12, the method further comprising:

storing the series of bias values to a memory.

19. A data storage device, the storage device comprising:

a storage medium;

a sensor device disposed in relation to the storage medium and operable to sense a first information set from the storage medium and to provide a corresponding first analog signal, and to sense a second information set from the storage medium and to provide a corresponding second analog signal;

an analog to digital converter circuit operable to convert a derivative of the first analog signal to a first series of digital samples, and to convert a derivative of the second analog signal to a second series of digital samples;

an equalizer circuit operable to perform an equalization on the first series of digital samples to yield a first data set, and to perform an equalization on the second series of digital samples to yield a second data set;

a data detector circuit operable to apply a data detection algorithm to a first data set to yield a first series of soft decision data, and to apply the data detection algorithm to a second data set to yield a second series of soft decision data; and a bias calculation circuit operable to calculate a series of bias values based at least in part on the first series of soft decision data and the second series of soft decision data, wherein the series of bias values correspond to a modification from an error rate corresponding to the first series of soft decision data to an error rate corresponding to the second series of soft decision data.

20. The storage device of claim 19, wherein the data detection algorithm is selected from a group consisting of: a maximum a posteriori data detection algorithm and a Viterbi data detection algorithm.

* * * * *